(12) United States Patent
Lee

(10) Patent No.: US 6,567,306 B2
(45) Date of Patent: May 20, 2003

(54) BLOCK ARCHITECTURE OPTION CIRCUIT FOR NONVALATILE SEMICONDUCTOR MEMORY DEVICES

(75) Inventor: June Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/058,898

(22) Filed: Jan. 24, 2002

(65) Prior Publication Data

US 2002/0071310 A1 Jun. 13, 2002

Related U.S. Application Data

(62) Division of application No. 09/594,747, filed on Jun. 13, 2000.

(30) Foreign Application Priority Data

Jun. 24, 1999 (KR) ............................................. 99-24023

(51) Int. Cl.[7] .............................................. G11C 16/04
(52) U.S. Cl. ................................................. 365/185.11
(58) Field of Search ....................... 365/185.11, 230.04, 365/230.06, 230.01, 230.03, 226

(56) References Cited

U.S. PATENT DOCUMENTS

| | | | | |
|---|---|---|---|---|
| 5,402,383 A | * | 3/1995 | Akaogi | 365/185.12 |
| 5,461,646 A | | 10/1995 | Anvari | 375/347 |
| 5,473,775 A | | 12/1995 | Sakai et al. | 395/700 |
| 5,568,641 A | | 10/1996 | Nelson et al. | 395/700 |
| 5,701,492 A | * | 12/1997 | Wadsworth et al. | 711/103 |
| 5,982,661 A | | 11/1999 | Kawamata | 365/185.01 |
| 6,119,226 A | | 9/2000 | Shiau et al. | 713/2 |
| 6,400,611 B1 | * | 6/2002 | Franklin et al. | 365/185.33 |

FOREIGN PATENT DOCUMENTS

JP  11-86600  3/1999

OTHER PUBLICATIONS

Derwent Abstract of JP 11086600A in English.

* cited by examiner

Primary Examiner—Richard Elms
Assistant Examiner—Anh Phung
(74) Attorney, Agent, or Firm—Marger Johnson & McCollom, P.C.

(57) ABSTRACT

A nonvolatile semiconductor memory device is described, which includes a memory cell array, a block address input circuit, and a block selection circuit. The memory cell array includes a plurality of normal blocks for storing normal data, and a plurality of boot blocks for storing boot codes initializing a system. Further, the nonvolatile semiconductor memory device has a plurality of boot block architecture options. The boot block input circuit receives an external block address, and coverts the external block address into an internal block address in accordance with selected one of a plurality of the boot block architecture options. Further, the block address input circuit includes an option selection portion having a pair of terminals. The block selection circuit selects one of the blocks of the memory cell array in response to the internal block address. The selection of one of the boot block architecture options is determined by electric connection/disconnection of the terminals of the option selection portion.

13 Claims, 14 Drawing Sheets

Fig. 14A

| Block | Block Address | | | | | | Block Size |
| --- | --- | --- | --- | --- | --- | --- | --- |
| | A18 | A17 | A16 | A15 | A14 | A13 | (Kbytes/Kwords) |
| BLK0 | 1 | 1 | 1 | 1 | 1 | 1 | 16/8 |
| BLK1 | 1 | 1 | 1 | 1 | 1 | 0 | 16/8 |
| BLK2 | 1 | 1 | 1 | 1 | 0 | 1 | 16/8 |
| BLK3 | 1 | 1 | 1 | 1 | 0 | 0 | 16/8 |
| BLK4 | 1 | 1 | 1 | 0 | X | X | 64/32 |
| BLK5 | 1 | 1 | 0 | 1 | X | X | 64/32 |
| BLK6 | 1 | 1 | 0 | 0 | X | X | 64/32 |
| BLK7 | 1 | 0 | 1 | 1 | X | X | 64/32 |
| BLK8 | 1 | 0 | 1 | 0 | X | X | 64/32 |
| BLK9 | 1 | 0 | 0 | 1 | X | X | 64/32 |
| BLK10 | 1 | 0 | 0 | 0 | X | X | 64/32 |
| BLK11 | 0 | 1 | 1 | 1 | X | X | 64/32 |
| BLK12 | 0 | 1 | 1 | 0 | X | X | 64/32 |
| BLK13 | 0 | 1 | 0 | 1 | X | X | 64/32 |
| BLK14 | 0 | 1 | 0 | 0 | X | X | 64/32 |
| BLK15 | 0 | 0 | 1 | 1 | X | X | 64/32 |
| BLK16 | 0 | 0 | 1 | 0 | X | X | 64/32 |
| BLK17 | 0 | 0 | 0 | 1 | X | X | 64/32 |
| BLK18 | 0 | 0 | 0 | 0 | X | X | 64/32 |

Fig. 14B

| Block | Block Address | | | | | | Block Size (Kbytes/Kwords) |
|---|---|---|---|---|---|---|---|
| | A18 | A17 | A16 | A15 | A14 | A13 | |
| BLK18 | 1 | 1 | 1 | 1 | X | X | 64/32 |
| BLK17 | 1 | 1 | 1 | 0 | X | X | 64/32 |
| BLK16 | 1 | 1 | 0 | 1 | X | X | 64/32 |
| BLK15 | 1 | 1 | 0 | 0 | X | X | 64/32 |
| BLK14 | 1 | 0 | 1 | 1 | X | X | 64/32 |
| BLK13 | 1 | 0 | 1 | 0 | X | X | 64/32 |
| BLK12 | 1 | 0 | 0 | 1 | X | X | 64/32 |
| BLK11 | 1 | 0 | 0 | 0 | X | X | 64/32 |
| BLK10 | 0 | 1 | 1 | 1 | X | X | 64/32 |
| BLK9 | 0 | 1 | 1 | 0 | X | X | 64/32 |
| BLK8 | 0 | 1 | 0 | 1 | X | X | 64/32 |
| BLK7 | 0 | 1 | 0 | 0 | X | X | 64/32 |
| BLK6 | 0 | 0 | 1 | 1 | X | X | 64/32 |
| BLK5 | 0 | 0 | 1 | 0 | X | X | 64/32 |
| BLK4 | 0 | 0 | 0 | 1 | X | X | 64/32 |
| BLK3 | 0 | 0 | 0 | 0 | 1 | 1 | 16/8 |
| BLK2 | 0 | 0 | 0 | 0 | 1 | 0 | 16/8 |
| BLK1 | 0 | 0 | 0 | 0 | 0 | 1 | 16/8 |
| BLK0 | 0 | 0 | 0 | 0 | 0 | 0 | 16/8 |

BLOCK ARCHITECTURE OPTION CIRCUIT FOR NONVALATILE SEMICONDUCTOR MEMORY DEVICES

This application is a divisional of U.S. patent application Ser. No. 09/594,747 filed on Jun. 13, 2000, now pending, which is herein incorporated by reference in its entirety.

FIELD OF THE INVENTION

The present invention relates to a semiconductor memory device and, more particularly, to a block architecture option circuit for nonvolatile semiconductor memory devices.

BACKGROUND OF THE INVENTION

In general, semiconductor memory devices for storing data are classified into volatile memory devices such as DRAM (dynamic random access memory) and SRAM (static random access memory), and nonvolatile memory devices such as PROM (programmable read only memory), EPROM (erasable programmable read-only memory), EEPROM (electrically erasable and programmable read-only memory), and FRAM (ferroelectric random access memory device). Volatile memory devices lose stored data at power-off, but nonvolatile memory devices maintain stored data even after power-off. Therefore, high-density nonvolatile memory devices, in particular, flash EEPROM devices have been widely applied to various fields such as computer systems and digital handy terminals. Due to high programming speed and low power consumption, the flash EEPROM device can be used as a BIOS-ROM (basis input/output system-read-only memory) in personal computer systems and large-amount storing media of integration circuit cards for digital cameras and personal computers. Systems having nonvolatile memories are disclosed in U.S. Pat. Nos. 5,461,646 and No. 5,568,641. Further, a personal computer system using a flash memory as a BIOS-ROM is disclosed in U.S. Pat. No. 5,473,775.

A flash memory cell includes a field effect transistor having a control gate, a floating gate, a source, and a drain. The charge on the floating gate is changed to change the threshold voltage of a flash cell, storing data in the flash cell.

From a standpoint of a memory cell structure, flash EEPROM devices are classified into NAND-type devices and NOR-type devices. A memory of a NAND structure requires one contact per one unit (i.e., string) where a plurality of cells are connected in series. In a memory of a NOR structure, each cell is independently coupled to a bit line and a word line, reducing interruptions caused by other cells during the write or read operation of any cell. Having a relatively large cell current, the memory of a NOR structure can be operated with high speed in comparison with the memory of a NAND structure.

The newest high-integrated NOR flash EEPROM devices adopt a cell array architecture, which is divided into a number of unit regions. That is, bulk and cell transistors are divided into a plurality of sectors or blocks and sources of the cell transistors in a block are connected to a corresponding divided bulk in common. This structure enables all cells in a block to be erased at the same time. Generally, the NOR flash EEPROM devices are programmed with a unit of 1 byte (=8 bits) or 1 word (=16 bits).

In a NOR flash memory device, there are normal blocks for storing normal data and boot (or parameter) blocks. Each of the normal blocks has a size of 64 Kbytes (=32 Kwords). The boot blocks have various sizes such as 32 Kbytes (=16 Kwords), 16 Kbytes (=8 Kwords), and 8 Kbytes (=4 Kwords). These boot blocks are disclosed in U.S. Pat. No. 5,701,492. A boot block of a nonvolatile semiconductor memory is used to store a relatively small amount of information, such as BIOS code data or a password of a computer or a digital handy terminal system. At power-up, a CPU (central processing unit) of a system accesses the boot block in the first place. Compared with normal blocks, erasing and programming operations of the boot block are more frequently performed.

Based on the address coding of a CPU, a cell array block architecture of a nonvolatile semiconductor memory device is generally divided into a top boot block architecture and a bottom boot block architecture.

FIG. 1A shows a top boot block architecture of a memory cell array 100 in accordance with the prior art. In the top boot block architecture, boot blocks B_BLK0–B_BLKm are disposed in a higher order address region and normal blocks N_BLK0–N_BLKn are disposed in a lower order address region. When a system is powered up, a CPU supplies the highest block address for the first boot block B_BLK0 to a nonvolatile memory device, and reads boot codes required for initialization of the system from the first boot block B_BLK0. Then, the CPU accesses the block addresses according to a predetermined order and reads boot codes stored in the other boot blocks B_BLK1–B_BLKm.

FIG. 1B shows a bottom block architecture of a memory cell array 100 in accordance with a prior art. In the bottom boot block architecture, boot blocks B_BLK0—B_BLKm are disposed in a lower order address region and normal blocks are disposed in a higher order address region. When a system is powered up, a CPU supplies the lowest block address for the first boot block B_BLK0 to a non-volatile memory device, and reads boot codes required for initialization of the system from the first boot block B_BLK0. Then, the CPU accesses the block addresses according to a predetermined order and reads boot codes stored in the other boot blocks B_BLK1–B_BLKm.

In order to meet requirements for the two kinds of block architecture options, a metal layer option method is utilized in the prior art.

FIG. 2 is a block diagram showing a cell array 100, a block address buffer circuit 210, and a block selection circuit 220 of a nonvolatile semiconductor memory device using the metal layer option method in accordance with the prior art. Referring now to FIG. 2, the block address buffer circuit 210 comprises a NOR gate circuit 211, inverter gate circuits 212, 213, 217, and 218, and metal wirings 215, 216a, and 216b. The NOR gate circuit 211 receives an external block address Axi and a chip enable signal to generate an internal block address signal Ai. A block selection circuit 220 responses to the internal block address Ai to select a corresponding block in the memory cell array 100.

In a conventional metal layer option method, a nonvolatile semiconductor memory device is designed on the basis of one of the top and the bottom boot block architectures. Then, according to requirement of a user, an inverter gate circuit 214 is added to or separated from a block address buffer circuit 210. If the memory device is designed to have the top boot block architecture, the inverter gate circuit 214 is not required in the block address buffer circuit 210 of FIG. 2. Therefore, metal wiring 215 between inverter gate circuits 213 and 217 is formed and other metal wirings 216a and 216b are not formed. If a user requires the memory device to have the bottom boot block architecture, the inverter gate circuit 214 should be added to the block address buffer circuit 210. In this case, the metal wiring 216a between the inverter gate circuits 213 and 214, and the metal wiring 216b between the inverter gate circuits 214 and 217 should be formed while the metal wiring 215 between the inverter gate circuits 213 and 217 should not be formed. Because polarity of an output signal Ai of the block address buffer circuit 210 is inverted in the bottom boot block architecture, the decoding order of a block address will be the reverse of that of the top boot block architecture.

These cell array block options can be supplied to a user utilizing metal masks or reticles, which are different from each other, in the final fabrication stage. A nonvolatile semiconductor memory device such as a conventional NOR flash memory supports a variety of package options. If cell array options meeting the requirements of a user are added thereto, the number of the metal reticles will be twice as many as without the additional requirements. This leads to increase in device production cost.

SUMMARY OF THE INVENTION

It is an object of the invention to provide a nonvolatile memory device which can solve the foregoing problems.

It is another object of the invention to provide a block option circuit which is capable of making a nonvolatile semiconductor memory device selectively supply one of the block architecture options of a cell array without requiring a metal layer option method.

According to the invention, a nonvolatile semiconductor memory device comprises a memory cell array, a block address input circuit, and a block selection circuit. The memory cell array includes a plurality of normal blocks for storing normal data, and a plurality of boot blocks for storing boot codes to initialize a system in which a memory device of this invention is used. The nonvolatile semiconductor memory device of this invention supports a plurality of boot block architecture options for user selection. The block address input circuit includes means for storing block architecture information indicating one of the boot block architecture options, and converts an external block address into an internal block address in accordance with the stored boot block architecture information. Converting the block address by the block address input circuit is controlled by the stored block architecture information. The block selection circuit selects one of blocks of the memory cell array in response to an internal block address supplied from the block address input circuit.

In a preferred feature of the invention, a block address input circuit includes option selection means having a pair of terminals. The option selection means is composed of, for example, one fuse or a pair of pad terminals and a bonding wire. Selecting one of boot block architecture options is determined by terminal-to-terminal electrical connection/disconnection of the option selection means.

In another preferred feature of the invention, a memory cell array is divided into a top address region and a bottom address region. The memory cell array includes a top boot block architecture option and a bottom boot block architecture option, which arrange boot blocks in the top and the bottom address regions, respectively. If a nonvolatile memory device utilizing the invention has the top boot block architecture option, an internal block address is identical to an external block address. On the other hand, if the nonvolatile memory device has the bottom boot block architecture option, the internal block address is different from the external block address.

In another preferred feature of the invention, a nonvolatile semiconductor memory device comprises a memory cell array, a power supply voltage detection circuit, an option flag circuit, a block address buffer circuit, and a block selection circuit. The detection circuit detects the power supply voltage and generates a detection signal when the power supply voltage reaches a predetermined level. The option flag circuit generates a flag signal indicating one of a plurality of boot block architecture options in response to the detection signal. The address buffer circuit receives an external block address, and converts the external block address into an internal block address in response to the flag signal. The block selection circuit selects a corresponding block in the memory cell array in response to the internal block address. The option flag circuit includes option selection means having a first and a second terminals. A nonvolatile memory device based on this embodiment has one of the boot block architectures in accordance with the connection/disconnection of the first terminal to the second terminal. If the first terminal is electrically connected to the second terminal, the nonvolatile memory device has a top boot block architecture option. On the other hand, if the first terminal is electrically insulated from the second terminal, the nonvolatile memory device has a bottom boot block architecture option. In the nonvolatile memory device, the option selection means can be implemented by at least one fuse or at least one pair of pad terminals and a bonding wire.

In another preferred feature of the invention, a block address input circuit converting an external block address into an internal block address comprises at least one nonvolatile memory cell. Block architecture information is stored in the nonvolatile memory cells. Converting the block address by the block address input circuit is controlled by the stored block architecture information.

In another preferred feature of the invention, block architecture information is stored in at least one of cell of a memory cell array. Converting the block address by the block address input circuit is controlled by the stored block architecture information.

In another preferred feature of the invention, a nonvolatile semiconductor memory device comprises a memory cell array having top and bottom block architecture options; an option plug circuit having a pair of pad terminals, an input terminal connected to these terminals in common, and an output terminal for outputting a flag signal indicating one of the boot block architecture options; a block address buffer circuit receiving external block address and converting the external address into the internal block address in response to the flag signal; and a block selection circuit selecting corresponding one of the blocks of the memory cell array in response to the internal block address. One of the boot block architecture options is determined by connecting one of a pair of the pad terminals to one of power supply voltage and ground voltage.

BRIEF DESCRIPTION OF THE DRAWINGS

FIGS. 14A–14B are tables showing address ranges allocated to blocks in accordance with top and bottom block architectures, respectively.

DESCRIPTION OF THE PREFERRED EMBODIMENT

The present invention is related to a block architecture of a cell array of a nonvolatile semiconductor memory device such as PROM, EPROM, EEPROM, and FRAM. The present invention will now be described hereinafter more fully with reference to attached drawings, in which same reference numbers denote same elements, and conventional elements are drawn with a block shape or skipped to allow for clarity in the features and aspects of the present invention. Specific numerical values, circuit compositions, and block architectures presented in the following description and attached drawings are helpful for thorough understanding of the invention and not limited to them.

Figure 1A:
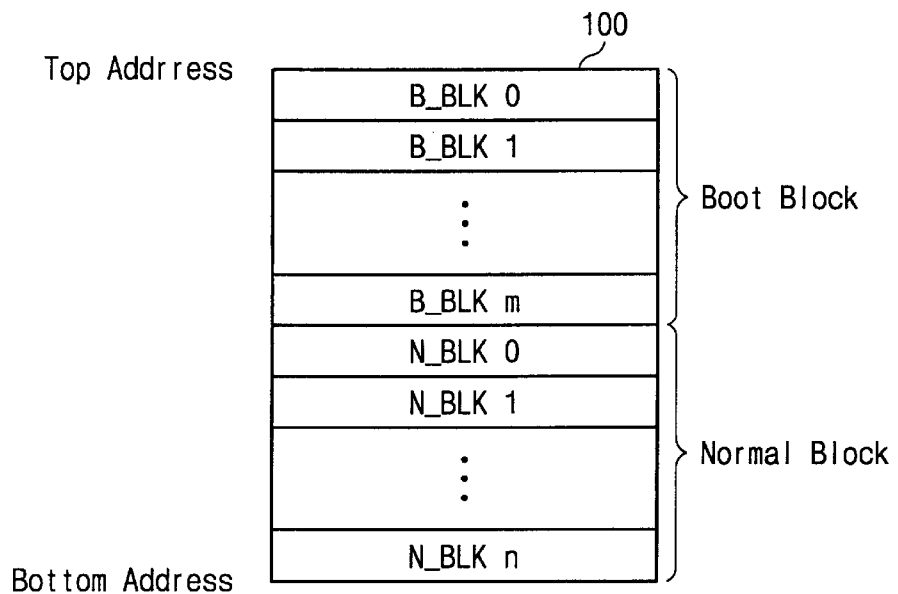
FIGS. 1A–1B are diagrams showing block architectures of a cell array of nonvolatile semiconductor memory devices in accordance with the prior art.
Figure 1B:
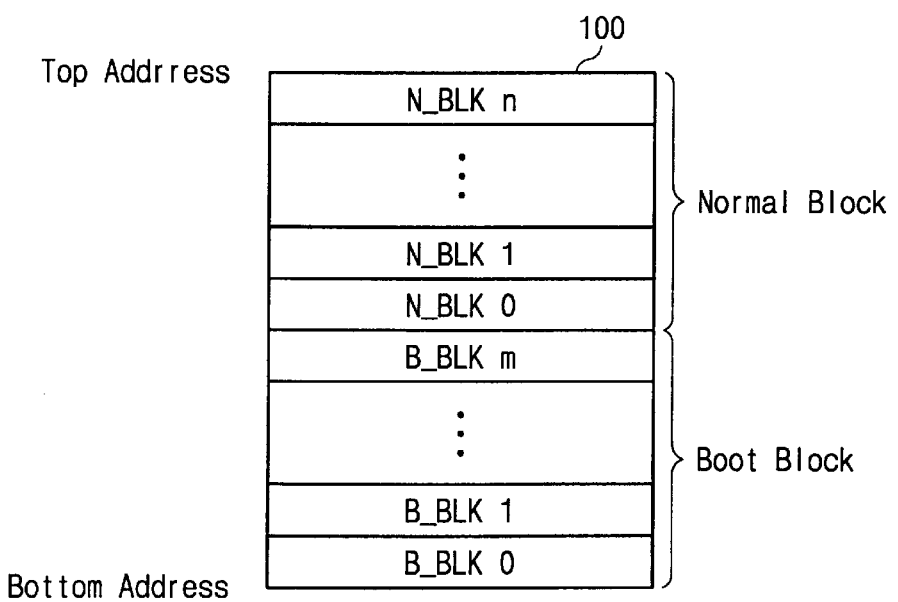
Figure 2:
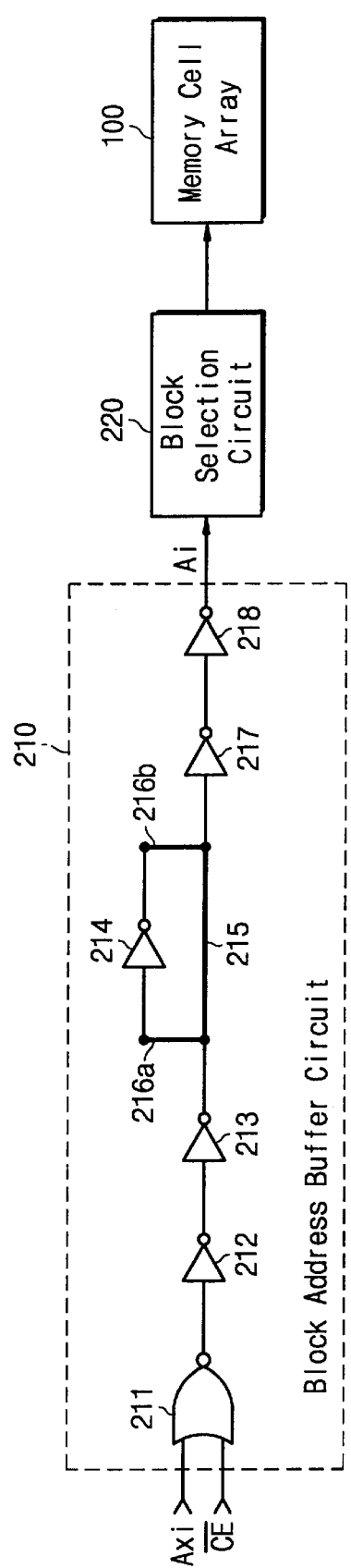
FIG. 2 is a block diagram showing a cell array, a block address buffer circuit, and a block selection circuit of a nonvolatile semiconductor memory device in accordance with the prior art.
Figure 3A:
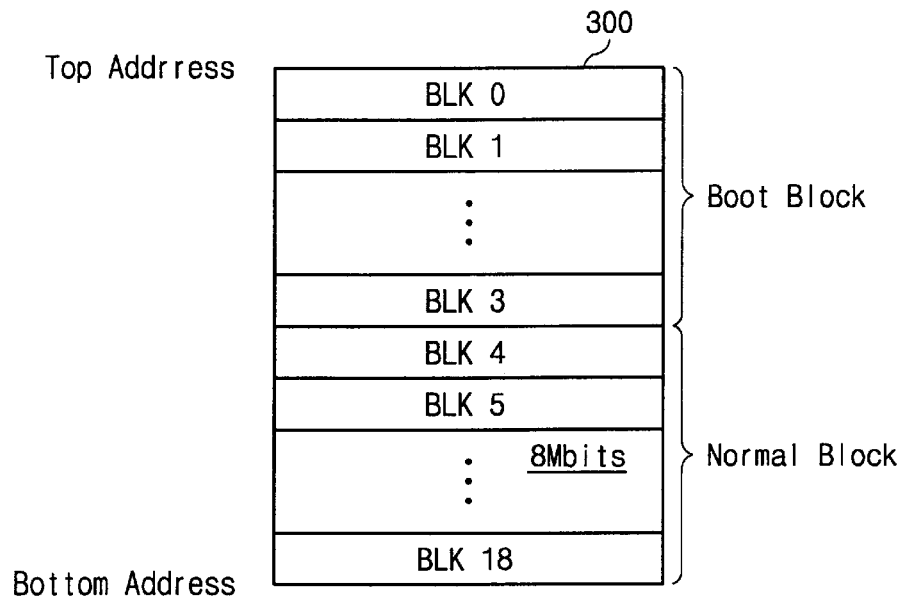
FIGS. 3A–3B are diagrams showing block architectures of a cell array of nonvolatile semiconductor memory devices in accordance with the present invention.
Figure 3B:
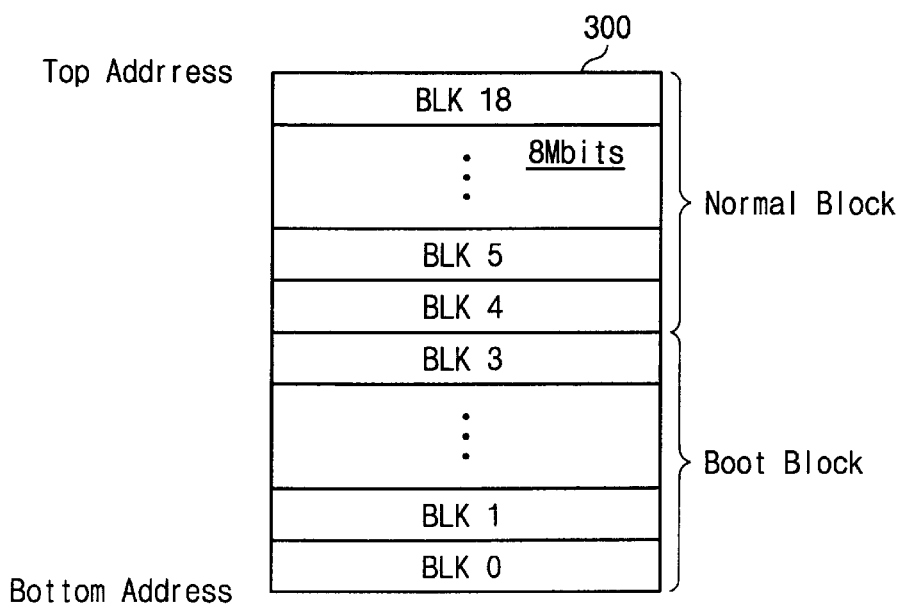

FIG. 3A shows a top boot block architecture of a cell array 300 of a nonvolatile semiconductor memory device in accordance with the invention. Assume that the memory device has a storage capacity of 8 megabits per block. FIG. 3B shows a bottom boot block architecture of a cell array 300 of a nonvolatile semiconductor memory device in accordance with the invention. Referring now to FIGS. 3A–3B, memory cell array 300 is divided into 19 blocks BLK0–BLK18 (i.e., 4 boot blocks BLK0–BLK3 and 15 normal blocks BLK4–BLK18).

FIG. 14A is a table showing address ranges allocated to the blocks BLK0–BLK18 shown in FIG. 3A in accordance with a top boot block architecture. "A minimum address group" for selecting a specific block out of the whole addresses is called "a block address." In the table of FIG. 14A, bit signals A18–A13 represent a block address. Each of the normal blocks BLK4–BLK18 of 64 Kbytes (=32 Kwords) can be selected by decoding only address bit signals A18–A15. The values of the other address bit signals A14 and A13 do not matter. Address signals A14–A13 of 2 bits are further required for selecting each of the boot blocks BLK0–BLK3 of 16 Kbytes (=8 Kwords). As shown in the table of FIG. 14A, the boot blocks BLK0–BLK3 are arranged in a top address region of a memory cell array 300, and the normal blocks BLK4–BLK18 are arranged in a bottom address region.

FIG. 14B is a table showing address ranges allocated to the blocks BLK0–BLK18 shown in FIG. 3B in accordance with a bottom boot block architecture.

As can be seen in the table of FIG. 14B, each of normal blocks BLK4–BLK18 of 64 Kbytes can be designated by decoding only address bit signals A18–A15. The values of the other address bit signals A14 and A13 do not matter. The boot blocks BLK0–BLK3 are arranged in a bottom address region of a memory cell array 300, and normal blocks BLK4–BLK14 are arranged in a top address region.

It will be understood that block architectures of a memory cell array 300 shown in the tables of FIGS. 14A–14B are only examples, and a nonvolatile memory device of this invention can have various different block architectures in accordance with storage capacity and requirement of users. That is, it will be understood that the number and sizes of normal and boot blocks in a memory cell array can be varied.

Figure 4:
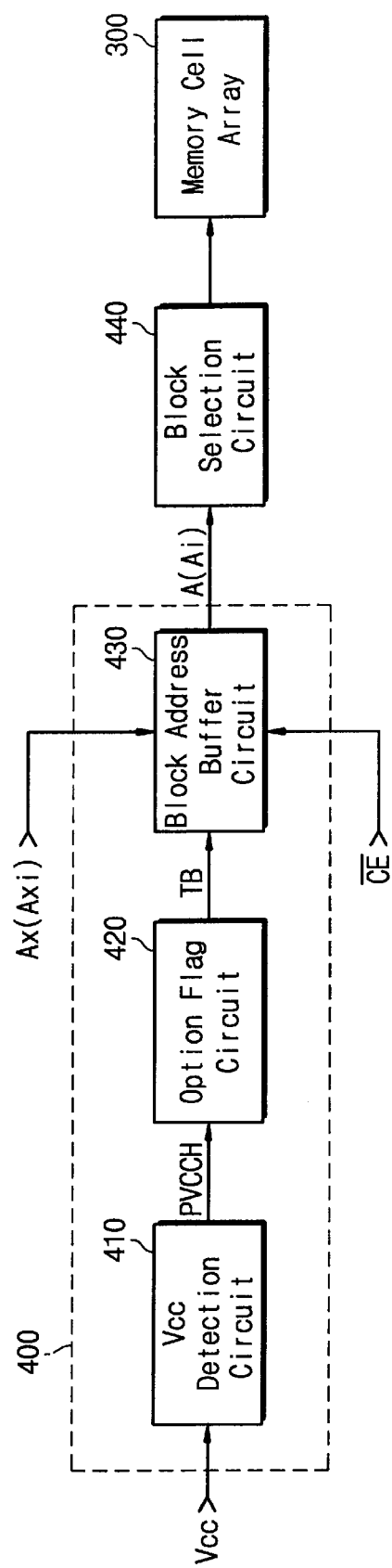
FIG. 4 is a block diagram showing a cell array, a block address input circuit, and a block selection circuit of a nonvolatile semiconductor memory device in accordance with one embodiment of the present invention.

FIG. 4 is a block diagram showing a memory cell array 300, a block address input circuit 400, and a block selection circuit 440 of a nonvolatile semiconductor memory device in accordance with the present invention. Referring now to FIG. 4, the memory cell array 300 includes 15 normal blocks BLK4–BLK18 for storing normal data and 4 boot blocks for storing boot codes initializing a system in which the semiconductor memory device are used. The block address input circuit 400 receives an external block address Ax, and converts the external block address Ax into an internal block address A in accordance with the selected top or bottom boot block architecture option. The block address input circuit 400 includes option selection means (e.g., one fuse or a pair of pad terminals) having a pair of terminals, and a bonding wire. The block selection circuit 440 selects one of the 19 blocks in the memory cell array 300 in response to the internal block address A from the blocks address input circuit 400.

The address input circuit 400 comprises a power supply voltage detection circuit 410, an option flag circuit 420, and a block address buffer circuit 430. The power supply voltage detection circuit 410 detects power supply voltage VCC during power-up, generating a detection signal PVCCH whose voltage follows the level of the power supply voltage VCC in the early stage of the power-up. When the power supply voltage VCC reaches a predetermined level, the detection signal PVCCH changes to a predetermined logic state (preferably, a lower level or logic "0"). The option flag circuit 420 generates a flag signal TB indicating one of top and bottom boot block architecture options in response to the detection signal PVCCH. The option flag circuit 420 includes option selection means (not shown) having a pair of terminals. Selecting one of the boot block architecture options is determined by electrical terminal-to-terminal connection/disconnection. A fuse or a pair of pad terminals and a bonding wire can be used as the option selection means. This will be described hereinafter more fully with reference to accompanying drawings.

Figure 5:
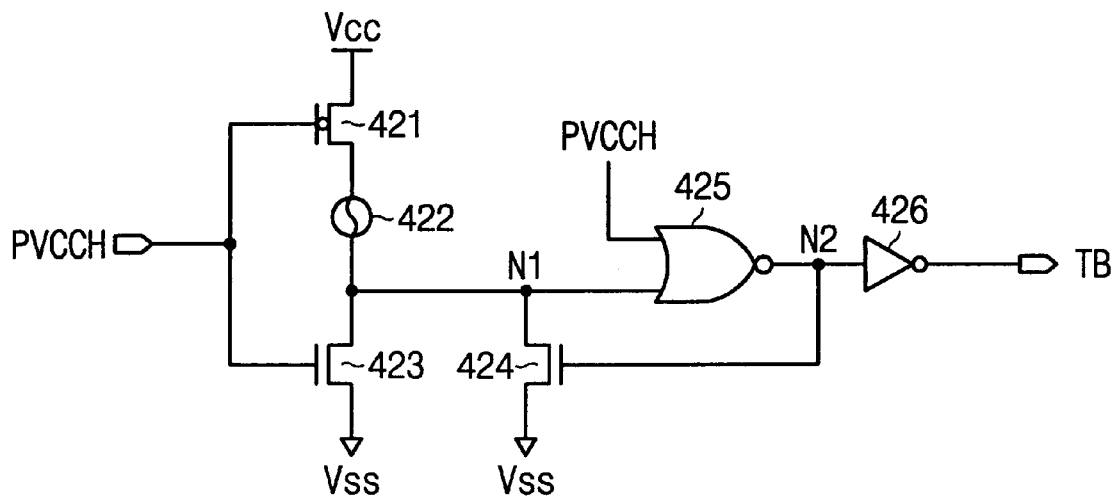
FIG. 5 is a circuit diagram showing one embodiment of the option flag circuit of FIG. 4.

FIG. 5 is a circuit diagram showing one embodiment of an option flag circuit 420 of FIG. 4. As shown in FIG. 5, an option flag circuit 420 includes a fuse 422 as option selection means. It is preferable that the fuse 422 be cut by laser beam or electric energy. The option flag circuit 420 includes a PMOS transistor 421 and an NMOS transistor 423, which form a CMOS inverter logic gate circuit together with the fuse 422. Control electrodes (i.e., gate electrodes) of the PMOS and the NMOS transistors 421 and 423 are commonly connected to a detection signal PVCCH from a power supply detection circuit 410. The source/drain current path of the PMOS transistor 421 is connected between power supply voltage VCC and one terminal of the fuse 422. The source/drain current path of the NMOS transistor 423 is connected to ground voltage VSS and the other terminal of the fuse 422. The option flag circuit 420 further includes an NMOS transistor 424, a NOR gate circuit 425, and an inverter gate circuit 426. One input terminal of the NOR gate circuit 425 is connected to the output terminal (i.e., node N1) of an inverter gate circuit which comprises transistors 421 and 423. Another input terminal thereof receives the detection signal PVCCH. The source/drain current path of the NMOS transistor 424 is connected between the node N1 and the ground voltage VSS. The control electrode (i.e., gate electrode) of the NMOS transistor 424 is connected to the output terminal (i.e., node N2) of the NOR gate circuit 425. The input terminal of the inverter gate circuit 426 is connected to the output terminal (i.e., node N2) of the NOR gate circuit 425. The flag signal TB is supplied through the output terminal thereof.

When the fuse 422 is not shorted out, the option flag circuit 420 generates the flag signal TB at a high level or logic "1" indicating selection of a top boot block architecture. When the fuse 422 is shorted out, the circuit 420 generates the flag signal TB of a low level or logic "0" indicating selection of a bottom block architecture. This will be described hereinafter more fully.

Figure 6:
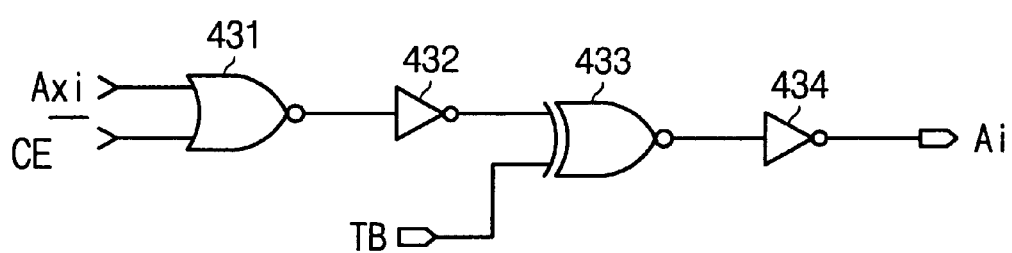
FIG. 6 is a circuit diagram showing one embodiment of the block address buffer circuit of FIG. 4.

FIG. 6 is a circuit diagram showing one embodiment of a block address buffer circuit 430 of FIG. 4. To simplify the drawing, only a unit block address buffer circuit 430 corresponding to a 1-bit block address signal Ax or Axi is shown in FIG. 6. However, the block address buffer circuit 430 generally comprises unit circuits that correspond to block addresses in the number.

Referring to FIG. 6, the unit block address buffer circuit 430 is composed of a NOR gate circuit 431, inverters 432 and 434, and an exclusive NOR (XNOR) gate circuit 433. One input terminal of the NOR gate circuit 431 receives a 1-bit signal Axi corresponding to an external block address, and the other terminal thereof receives a chip enable signal from the outside. The input terminal of the inverter gate circuit 432 is connected to the output terminal of the NOR gate circuit 431. As a matter of course, the NOR gate circuit 431 and the inverter gate circuit 432 can be replaced with one OR gate circuit. The XNOR gate circuit 433 includes one input terminal connected to the output terminal of the inverter gate circuit 432, and another input terminal receiving the flag signal TB from the option flag circuit 420. The inverter 434 includes an input terminal connected to the output terminal of the XNOR gate circuit 433, and the output terminal provides a 1-bit signal Ai corresponding to an internal block address. The XNOR gate circuit 433 and the inverter gate circuit 434 can be replaced with one XOR gate circuit.

When a nonvolatile semiconductor memory device of this invention has a top boot block architecture option, the block address buffer circuit 430 generates the same internal block address A or Ai as an external block address Ax or Axi. When the nonvolatile semiconductor memory device has a bottom boot block architecture option, the block address buffer circuit 430 generates an internal block address which is different from an external block address. Specifically, the block address buffer circuit 430 generates an internal block address which is the complement of the external block address.

Figure 7:
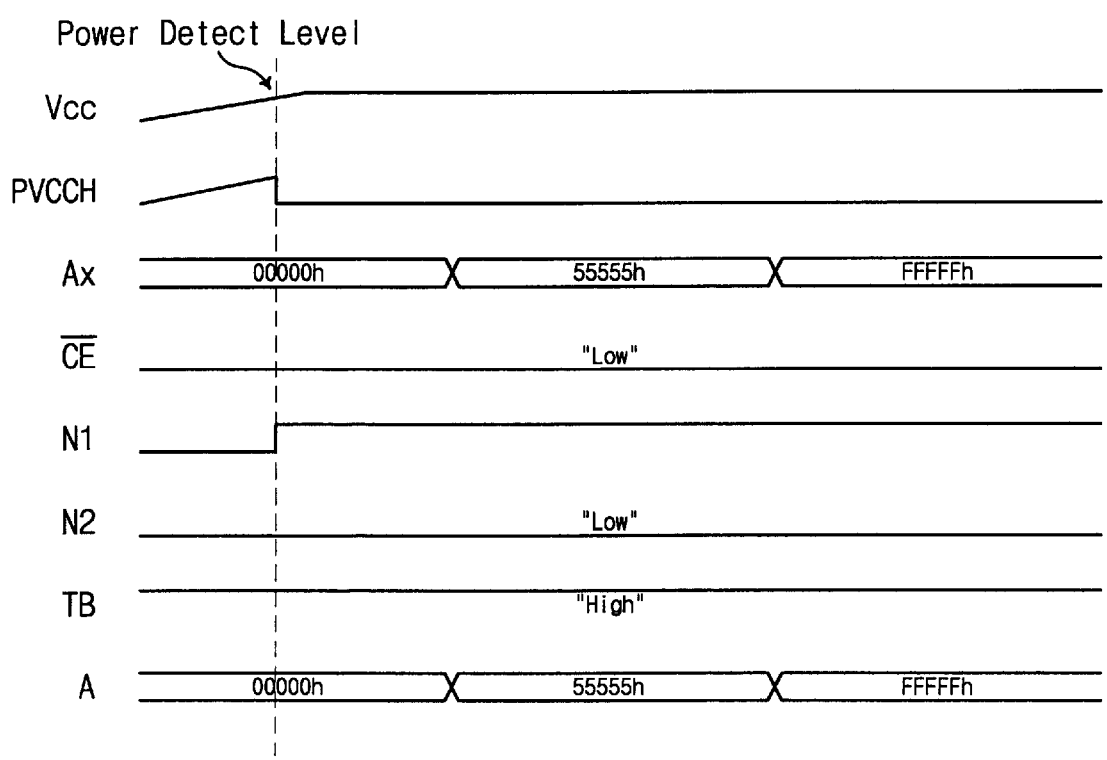
FIG. 7 is a timing view of a circuit of FIG. 4 in accordance with selection of a top block architecture option.
Figure 8:
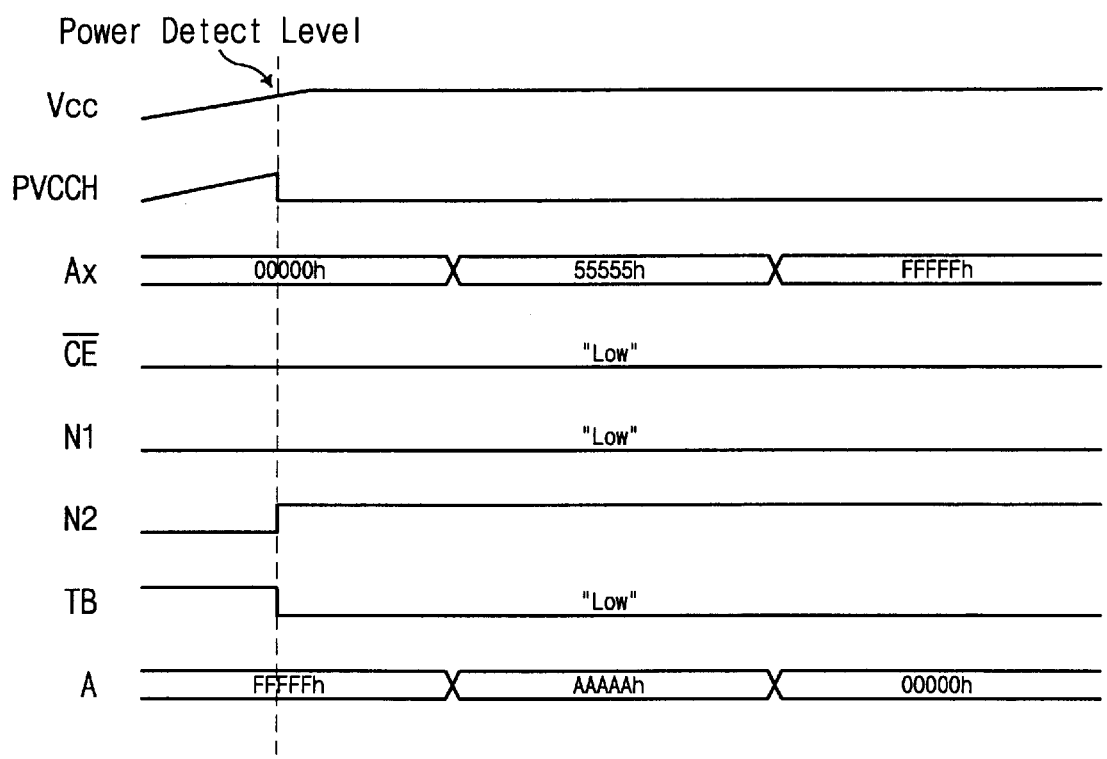
FIG. 8 is a timing view of a circuit of FIG. 4 in accordance with selection of a bottom block architecture option.

FIGS. 7–8 are timing views of a circuit shown in FIG. 4 according to selection of a top and a bottom block architecture options, respectively.

It will be described hereinafter that a cell array 300 of a nonvolatile semiconductor memory device of this invention has a top block architecture, i.e., fuse 422 is not shorted out with reference to FIG. 5 and FIG. 7.

In case of a cell array 300 having a top boot block architecture (i.e., a fuse 422 without a short), the case will be described with reference to FIG. 5 and FIG. 7. When power supply voltage VCC is boosted up at power-up of a system, VCC detection signal PVCCH outputted from power supply detection circuit 410 rises along a waveform. When the detection signal PVCCH passes an upper trip voltage level (corresponding to high level or logic "1") of an inverter gate circuit comprising the detection signal PVCCH and transistors 421 and 423, PMOS pull-up transistor 421 in flag option circuit 420 is turned off and NMOS pull-down transistor 423 is turned on. Therefore, node N1 is maintained at a low level. At this time, node N2 is maintained at a low level by the detection signal PVCCH at a high level. As shown in FIG. 7, when the power supply voltage VCC transitions to a predetermined level, the detection signal PVCCH goes down to a low level, the PMOS transistor 421 is turned on and the NMOS transistor 423 is turned off. Because the node N1 is maintained at a high level although the detection signal PVCCH is maintained at a low level, the N2 is still maintained at a low level. As a result, the flag option circuit 420 generates a flag signal TB of a high level, which indicates a top boot block architecture option.

If power is supplied to a system, a CPU sets a chip enable signal to a low level for system booting. Thus, NOR gate circuit 431 in the block address buffer signal 430 and output values (or polarities) of the inverter gate circuit 432 are set to the value (or polarity) of corresponding bit signal Axi of an external block address.

Specifically, if an external block address signal Axi is logic "0", the output of the inverter gate circuit 432 is also logic "0". If the signal Axi is logic "1", the output thereof is also logic "1". In a top boot block, the flag signal TB is logic "1". Therefore, if the external block address signal Axi is logic "0", the internal block address signal Ai is also logic "0". If the signal Axi is logic "1", the signal Ai is also logic "1". As a result, when a nonvolatile semiconductor memory device of this invention has a top boot block architecture option, the block address buffer circuit 430 generates the same internal block address A or Ai as the external block address Ax or Axi, as shown in FIG. 7.

It will be described hereinafter that a cell array 300 of a nonvolatile semiconductor memory device of this invention has a bottom block architecture, i.e., a fuse 422 is shorted out with reference to FIG. 5 and FIG. 8.

Node N1 is maintained at a low level at the same time as system power-up. At this time, node N2 is also maintained at a low level by the detection signal PVCCH of a high level. As shown in FIG. 8, when power supply voltage VCC reaches a predetermined level and then the detection signal PVCCH goes down to a low level, PMOS transistor 421 is turned on and NMOS transistor 423 is turned off. Since fuse 422 is shorted out, the node N1 is still maintained at a low level. Accordingly, the node N2 rises to a high level because the detection signal PVCCH from the VCC detection circuit 410 goes down to a low level. This turns on the NMOS transistor 424, so that the node N1 is maintained at a low level to prevent the node N2 from floating. As a result, a flag option circuit 420 generates a flag signal TB of a low level (logic "0") indicating a bottom boot block architecture option.

Because a chip enable signal is enabled in system booting by a CPU, NOR gate circuit 431 in block address buffer circuit 430 and output values (or polarities) of inverter gate circuit 432 are determined by a value (or polarity) of a corresponding bit signal Axi of an external block address.

Specifically, if an external block address signal Axi is logic "0", an output of the inverter gate circuit 432 is also logic "0". If the signal Axi is logic "1", the output thereof is also logic "1". In a bottom boot block, the flag signal TB is logic "0". Therefore, if the external block address signal Axi is logic "0", the internal block address signal Ai is logic "1". If the signal Axi is logic "1", the signal Ai is logic "0". As a result, when a nonvolatile semiconductor memory device of this invention has a bottom boot block architecture option, the block address buffer circuit 430 generates an internal block address A or Ai which is the complement of external block address Ax or Axi, as shown in FIG. 8.

Figure 9:
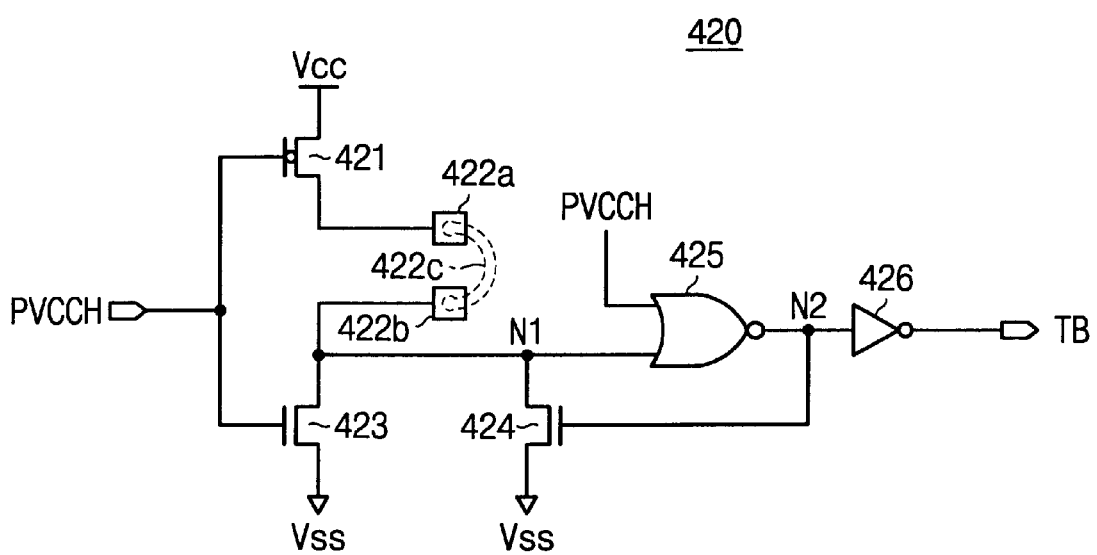
FIG. 9 is a circuit diagram showing another embodiment of an option flag circuit of FIG. 4.

FIG. 9 is a circuit diagram showing another embodiment of an option flag circuit 420 of FIG. 4. As shown in FIG. 9, an option flag circuit 420 of this embodiment has a composition same as a circuit shown in FIG. 5 except that instead of a fuse, a pair of pad terminals 422a and 422b and a bonding wire 422c are used for electric interconnection/disconnection of transistors 421 and 423. For selection of a top boot block architecture, pad terminals 422a and 422b are electrically interconnected by connecting a bonding wire 422c therebetween. For selection of a bottom block architecture, the pad terminals 422a and 422b are electrically isolated each other by not connecting the bonding wire 422c therebetween. Being identical to operation of a circuit shown in FIG. 5, operation of this circuit will not be described to avoid duplicate description herein.

Figure 10:
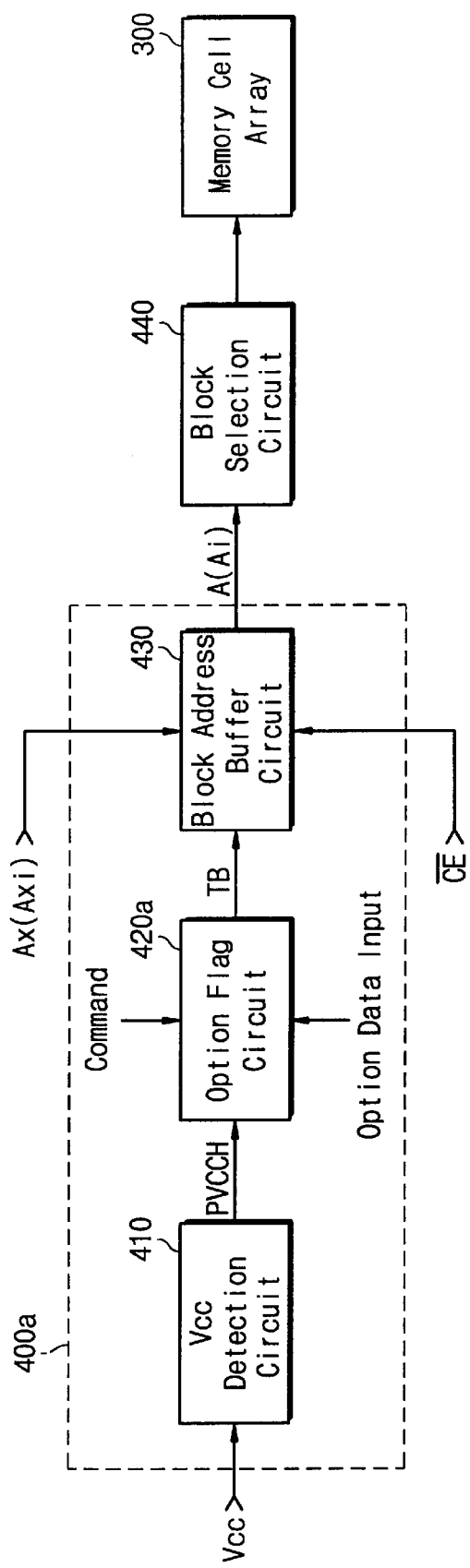
FIG. 10 is a block diagram showing a cell array, a block address input circuit, and a block selection circuit of a nonvolatile semiconductor memory device in accordance with another embodiment of the present invention.

FIG. 10 is a block diagram showing a memory cell array 300, a block address input circuit 400a, and a block selection circuit 440 of a nonvolatile semiconductor memory device in accordance with another embodiment of the invention. Referring now to FIG. 10, a nonvolatile semiconductor memory device of this embodiment has similar composition as the circuit shown in FIG. 4, except that block address input circuit 400a converting an external block address Ax into an internal block address A includes at least one nonvolatile memory cell which can store option data (i.e., block architecture information) in accordance with a command (e.g., CPU command) supplied from the outside. Block architecture information is stored in at least one of the nonvolatile memory cells, and controls conversion of a block address by a block address input circuit 400a.

Figure 11:
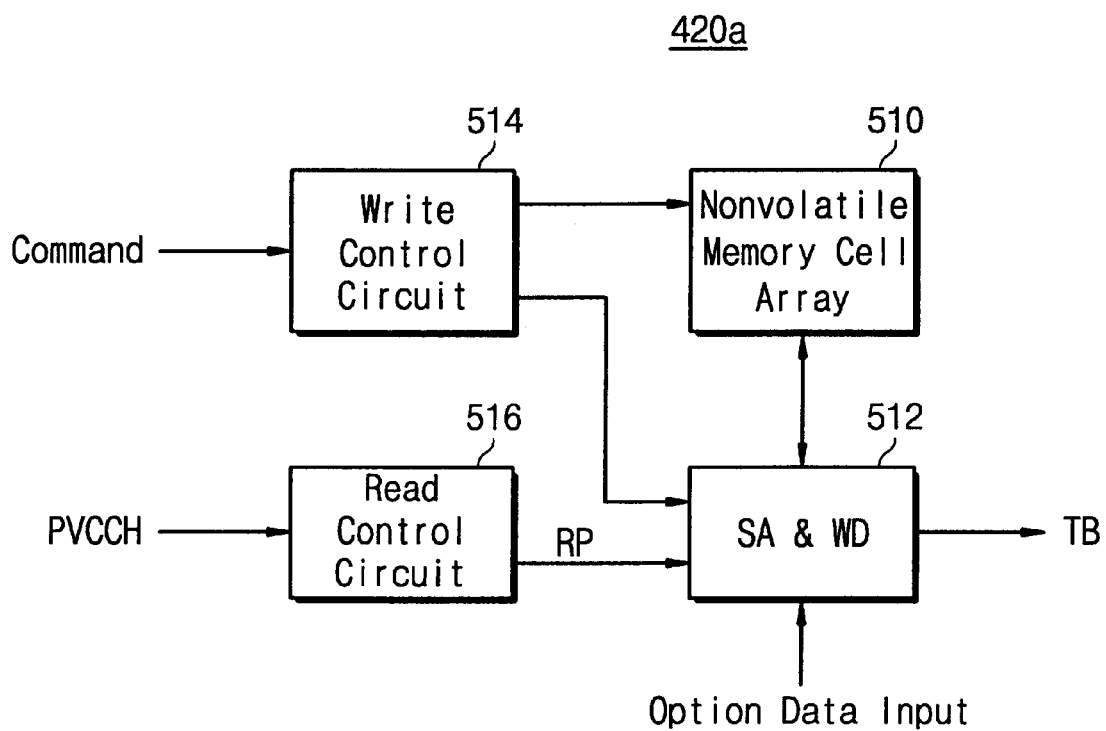
FIG. 11 is a circuit diagram showing one embodiment of an option flag circuit of FIG. 10.

FIG. 11 is a circuit diagram showing an embodiment of an option flag circuit 420a of FIG. 10, which includes a nonvolatile memory cell array 510, a sense amplifier and write driver 512, a write control circuit 514, and a read control circuit 516. If a write command is input, the write control circuit 514 controls the write driver 512 and stores option data (i.e., block architecture information) in a nonvolatile memory cell array 510. The read control circuit 516 generates a read enable pulse signal RP when a detection signal PVCCH is enabled from a power supply voltage detection circuit 410 (i.e., the signal PVCCH goes down to a low level). In response to the pulse signal RP, the sense amplifier 512 reads block architecture information including the option data (i.e., flag signal TB) stored in the nonvolatile memory cell array 510. A block address buffer circuit 430 is identical to that of FIG. 5; the operation thereof will be skipped to avoid duplicate description herein.

In a varied example of this embodiment, the block architecture information is stored in at least one cell of a memory cell array 300. In this case, special control circuits for write/read are unnecessary.

Figure 12:
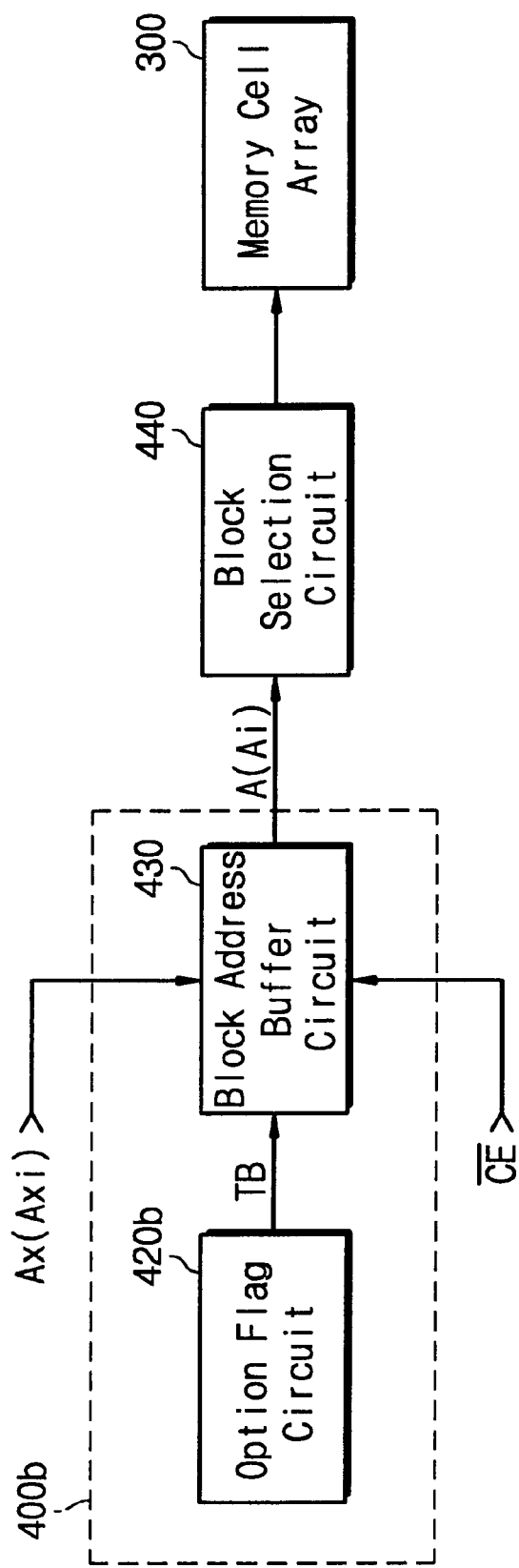
FIG. 12 is a block diagram showing a cell array, a block address input circuit, and a block selection circuit of a nonvolatile semiconductor memory device in accordance with further another embodiment of the present invention.

FIG. 12 is a block diagram showing a memory cell array 300, a block address input circuit 400b, and a block selection circuit 440 of a nonvolatile semiconductor memory device in accordance with another embodiment of the invention. As can be seen in FIG. 12, it is a structural feature of this nonvolatile semiconductor memory device that a special power supply voltage detection circuit (referring to a reference numeral 410 of FIG. 4 and FIG. 10) is unnecessary.

Figure 13:
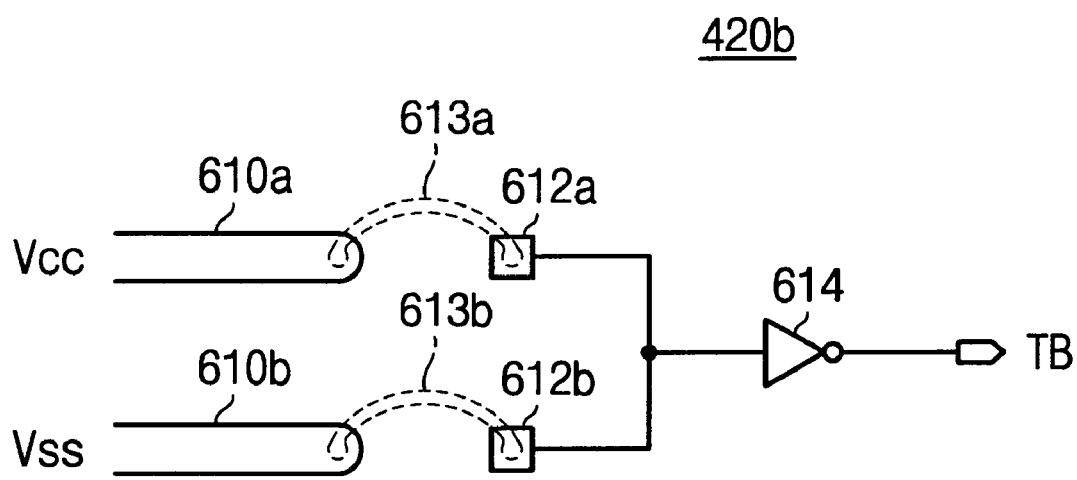
FIG. 13 is a circuit diagram showing one embodiment of an option flag circuit of FIG. 12.

FIG. 13 is a circuit diagram showing an embodiment of an option flag circuit 420b of FIG. 12, which is composed of a pair of pad terminals 612a and 612b and an inverter gate circuit 614. The terminals 612a and 612b correspond to a power supply voltage lead 610a and a ground voltage lead 610b of a lead frame, respectively. An input terminal of the inverter gate circuit 614 is commonly connected to the terminals 612a and 612b. The inverter gate circuit 614 generates a flag signal indicating one of boot block architecture options. One of a pair of the pad terminals 612a and 612b is electrically connected to one of the leads 610a and 610b, determining the selection of one of the options. Specifically, if the lead 610b and the pad 612b are electrically interconnected by a bonding wire 613b, the inverter gate circuit 614 generates a flag signal TB of a high level. So a top boot block architecture option is selected. A block address buffer circuit 430 is identical to that of FIG. 5 or FIG. 10, and the operation thereof will not be described to avoid duplicate description.

Instead of a metal layer option method, a fuse or a pad option method can be used to meet the user's requirement concerning block architecture options of a nonvolatile semiconductor memory cell array, reducing the manufacturing cost of a memory device. Further, fuse or pad terminals can be selectively connected or disconnected with simplicity before a package process of the nonvolatile semiconductor memory device, corresponding to the requirement of device-ordering person.

While this invention has been particularly shown and described with reference to the preferred embodiments thereof, it will be understood by those skilled in the art that various changes in form and details may be made without departing from the spirit and scope of this invention.

What is claimed is:

1. A nonvolatile semiconductor memory device comprising:

a memory cell array including a plurality of normal blocks for storing normal data and a plurality of boot blocks for storing boot codes initializing a system in which the semiconductor memory device is used, the memory cell array having a plurality of boot block architecture options;

a power supply voltage detection circuit for detecting power supply voltage and generating a detection signal when the power supply voltage goes to a predetermined level;

an option flag circuit for generating a flag signal selecting one of the plurality of the boot block architecture options in response to the detection signal;

a block address buffer circuit for receiving an external block address and converting the external block address into an internal block address in response to the flag signal, the block address buffer circuit inverting a phase of each bit in the external block address to generate the internal block address when the flag signal indicates a bottom boot option; and a block selection circuit for selecting a corresponding one of the blocks of the memory cell array in response to the internal block address.

2. The device of claim 1 wherein the option flag circuit includes option selection means with a first terminal and a second terminal, and the nonvolatile semiconductor memory device selects one of the boot block architecture options in accordance with an electric connection/disconnection between the first and the second terminals of the option selection means.

3. The device of claim 2 wherein the memory cell array is divided into a top address region and a bottom address region, and the nonvolatile semiconductor memory device includes a top block architecture option for arranging the boot blocks in the top address region and a bottom architecture option for arranging the boot blocks in the bottom address region.

4. The device of claim 3 wherein the nonvolatile semiconductor memory device uses the top boot block architecture option when the first and the second terminals are electrically interconnected.

5. The device of claim 3 wherein the nonvolatile semiconductor memory device uses the bottom block architecture option when the first and the second terminals are electrically isolated each other.

6. The device of claim 4 wherein the internal block address is identical to the external block address when the nonvolatile semiconductor memory device uses the top boot block architecture.

7. The device of claim 5 wherein the internal block address is different from the external block address when the nonvolatile semiconductor memory device uses the bottom boot block architecture.

8. The device of claim 3 wherein the option flag circuit comprises:
   a first transistor including a current path connected between the power supply voltage and the first terminal of the option selection means, and a first control electrode connected to the detection signal;
   a second transistor including a current path connected between the second terminal of the option selection means and a ground voltage, and a second control electrode connected to the detection signal;
   a NOR gate circuit including a first input terminal connected between the second terminal of the option selection means and the current path of the second transistor, a second input terminal connected to the detection signal, and an output terminal;
   a third transistor including a current path connected between the second terminal of the option selection means and the ground voltage, and a third control electrode connected to the output terminal of the NOR gate circuit; and
   an inverter gate circuit including an input terminal connected to the output terminal of the NOR gate circuit, and an output terminal for supplying the flag signal.

9. The device of claim 8 wherein the option selection means includes a fuse.

10. The device of claim 8 wherein the option selection means including a pair of pad terminals and a bonding wire.

11. The device of claim 1 wherein the block address buffer circuit comprises:
   a NOR gate circuit including a first input terminal for receiving a 1-bit signal of the external block address, a second input terminal for receiving a chip enable signal, and an output terminal;
   a first inverter gate circuit including an input terminal connected to the output terminal of the NOR gate circuit, and an output terminal;
   an exclusive NOR gate circuit including a first input terminal connected to the output terminal of the first inverter gate circuit, a second input terminal for receiving the flag signal, and an output terminal; and
   a second inverter gate circuit including an input terminal connected to the output terminal of the exclusive NOR gate circuit, and an output terminal for supplying a corresponding 1-bit signal of the internal block address.

12. The device of claim 1 wherein the block address buffer circuit comprises:
   an OR gate circuit including a first input terminal for receiving a 1-bit signal of the external block address, a second input terminal for receiving a chip enable signal, and an output terminal; and
   an exclusive OR gate circuit including a first input terminal connected to the output terminal of the OR gate circuit, a second input terminal for receiving the flag signal, and an output terminal for supplying a corresponding 1-bit signal of the internal address.

13. A nonvolatile semiconductor memory device comprising:
   a memory cell array including a plurality of normal blocks for storing normal data and a plurality of boot blocks for storing boot codes initializing a system in which the semiconductor memory device is used, the memory cell array having a plurality of boot block architecture options;
   an option flag circuit including a pair of pad terminals, an input terminal commonly connected to the pad terminals, and an output terminal indicating one of the boot block architecture options;
   a block address buffer circuit for receiving an external block address and converting the external block address into an internal block address, the block address buffer circuit inverting a phase of each bit in the external block address to generate the internal block address when the flag signal indicates a bottom boot option; and
   a block selection circuit for selecting a corresponding one of the blocks of the memory cell array in response to the internal block address,
   wherein one of the pair of pad terminals is electrically connected to one of power supply voltage and ground voltage to select one of the boot block architecture options.

* * * * *